United States Patent
Genz et al.

(12) 
(10) Patent No.: US 6,558,883 B2
(45) Date of Patent: May 6, 2003

(54) APPARATUS AND METHOD FOR PATTERNING A SEMICONDUCTOR WAFER

(75) Inventors: Oliver Genz, Dresden (DE); Jurgen Preuninger, Wappingers Falls, NY (US); Gerhard Kunkel, Radebeul (DE)

(73) Assignee: Infineon Technologies AG, Munich (DE)

( * ) Notice: Subject to any disclaimer, the term of this patent is extended or adjusted under 35 U.S.C. 154(b) by 70 days.

(21) Appl. No.: 09/801,413

(22) Filed: Mar. 8, 2001

(65) Prior Publication Data

US 2002/0127501 A1 Sep. 12, 2002

(51) Int. Cl.$^7$ .............................................. G03F 7/20
(52) U.S. Cl. ........................................ 430/397; 430/311
(58) Field of Search ................................. 430/397, 945, 430/311, 396

(56) References Cited

U.S. PATENT DOCUMENTS 5,593,800 A * 1/1997 Fujioka et al. ................. 430/5
5,879,842 A * 3/1999 Okino ........................... 430/22
6,117,598 A * 9/2000 Imai ............................. 430/22

* cited by examiner

Primary Examiner—Kathleen Duda
(74) Attorney, Agent, or Firm—Slater & Matsil, L.L.P.

(57) ABSTRACT

A method and apparatus (100) for patterning the surface of a semiconductor wafer (130). A stage (148) is coupled to a motor (150) that is adapted to move the stage (148) and a semiconductor wafer (130) in a horizontal direction at a first speed A. A mask (140) is disposed above the semiconductor wafer (130), the mask (140) being coupled to a motor (142) that is adapted to move the mask (140) in a horizontal direction at a second speed B. The ratio of the first and second speeds is different than the magnification factor, which may be other than 1:1 if a lens (120) is used. The mask (140) and the wafer (130) may be moved in the same horizontal direction simultaneously during the exposure process at different speeds B and A, respectively, to provide a magnification or demagnification of the mask (140) pattern onto the wafer (130) surface.

23 Claims, 3 Drawing Sheets

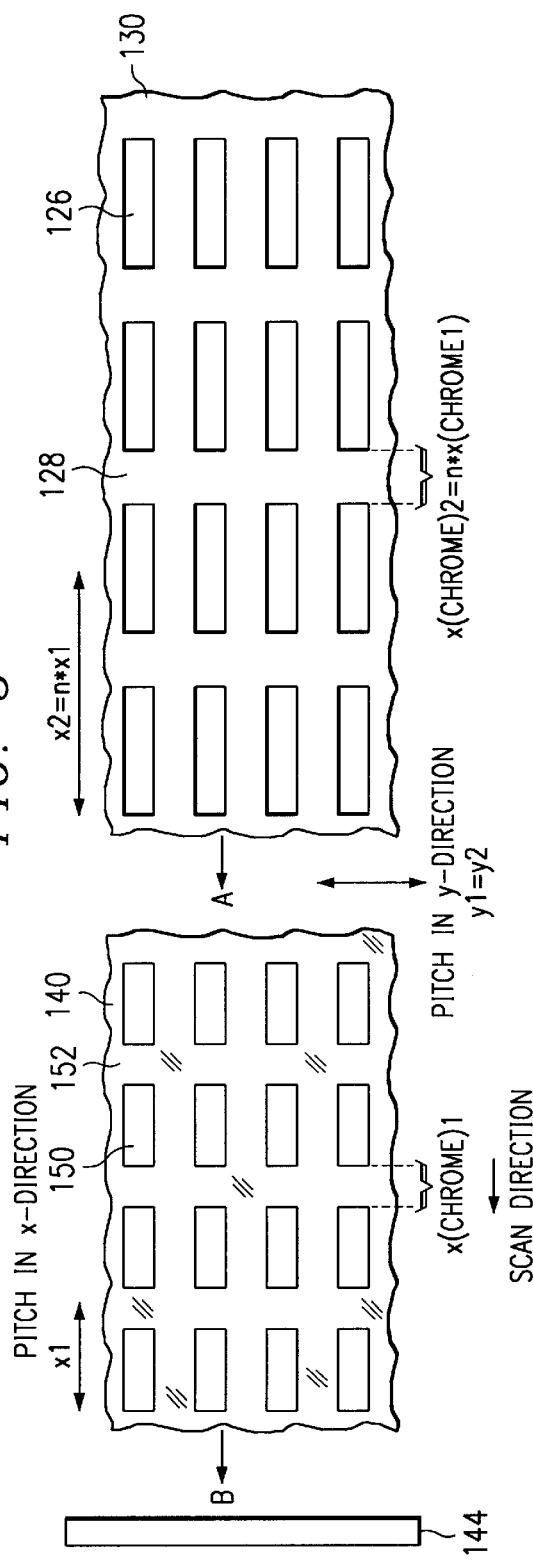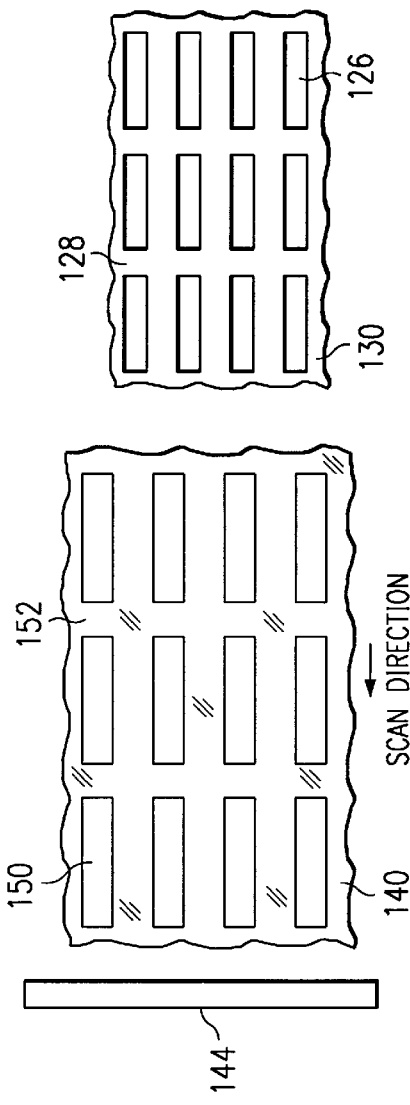

APPARATUS AND METHOD FOR PATTERNING A SEMICONDUCTOR WAFER

TECHNICAL FIELD

The present invention relates generally to the fabrication of semiconductor devices, and more particularly to a patterning apparatus and technique.

BACKGROUND OF THE INVENTION

Semiconductors are widely used for integrated circuits for electronic applications, including radios, televisions, and personal computing devices, as examples. Such integrated circuits typically include multiple transistors fabricated in single crystal silicon. It is common for there to be millions of semiconductor devices on a single semiconductor product. Many integrated circuits now include multiple levels of metallization for interconnections.

The fabrication of semiconductor devices involves depositing or forming metallization and dielectric layers, as well as active component layers. Each layer must be patterned with a desired pattern in order for the semiconductor devices to function properly. A patterning process typically involves depositing a photoresist that may comprise an organic polymer, for example, over a semiconductor wafer layer. The photoresist is exposed through a mask to transfer the pattern of the mask to the photoresist. Either exposed or unexposed portions of the photoresist are removed during subsequent development, depending on whether a positive or negative lithographic resist process is used. The photoresist portions remaining on the semiconductor wafer surface shield the top wafer surface during an etch process to leave the top semiconductor wafer layer residing in regions where photoresist remain.

A prior art apparatus 10 for patterning the surface of a semiconductor wafer 30 is shown in FIG. 1. A stage 12 is adapted to support a semiconductor wafer 30. The stage 12 is adapted to move the entire wafer 30 from position to position in order to expose portions of the wafer 30 surface during the patterning process. The stage 12 may be mounted on a base, not shown. The stage 12 is adapted to securely hold the wafer 30 in place. A lens 20 is disposed above the wafer 30. Lens 20 typically comprises a demagnification lens that reduces the image transferred to the wafer 30 by 4–5×, for example. Alternatively, no lens 20 may be required if a 1:1 ratio magnification scheme is used for transferring the pattern from the mask 18 to the wafer 30. A mask 18 having the desired pattern to be transferred to the wafer 30 is disposed above lens 20. A light source 16 is disposed above mask 18, as shown.

To pattern the wafer 30, the light source 16 which may comprise a laser, for example, is illuminated. The light passes through the mask 18, through demagnification lens 20, and exposes the top surface of the semiconductor wafer 30.

There are various types of exposure tools that function similar to the apparatus 10 described and illustrated in FIG. 1. In a step and repeat apparatus, the mask 18 pattern is transferred onto a section of the wafer 30 at a time, and a stage 12 moves the wafer 30 from point to point, exposing the wafer 30 surface in a plurality of steps.

An alternative apparatus used to pattern and expose a wafer 30 surface is known as a step and scan apparatus. Because the demagnification lens 20 is typically non-planar, the pattern of an image passed through the lens 20 may be distorted at the edges of the lens 20. A step and scan apparatus exposes the wafer 30 surface to a pattern through a fixed slit in a plate disposed between the light source and the lens 20. The mask 18 is moved at the same speed as the wafer 30 to expose and pattern the wafer 30 surface for 1:1 exposure, for example. Alternatively, the mask 18 may be moved at a different speed as the wafer 30, to correlate with the demagnification or magnification of the lens 20. For example, in the prior art, if a 4:1 demagnification lens is used, the wafer 20 is moved at a speed 4 times faster than the mask 18 is moved during the exposure process. Prior art step and scanners synchronize the scan speed of the mask 18 with the speed of the wafer 30 in accordance with the magnification of the lens.

FIG. 2 illustrates a top view of a mask 18 having transparent regions or holes 22 therein. A portion of a wafer 30 top surface is also shown, having much smaller dimensions than the mask 18 due to demagnification. Wafer regions 26 represent exposed portions of the semiconductor wafer 30 surface after patterning the wafer 30 using mask 18.

A problem with prior art patterning methods and apparatuses is that the islands 24 between the holes 22 in mask 18 are becoming smaller and smaller to meet the increased demands for miniaturization in semiconductor devices. As semiconductor devices are made smaller, it becomes more and more difficult to properly manufacture the devices. For example, holes 22 in mask 18 may represent an array of storage nodes of dynamic random access memory (DRAM) cells.

A mask 18 must be inspected for defects to insure that the proper pattern will be transferred to the wafer 30. The inspection dimensions have a lower limit, for example, on the order of 400 nanometers at the time of the filing of this patent. Typically, an optical microscope is used to inspect the mask in a die-to-die inspection or a die-to-database inspection, as examples. Therefore, the miniaturization of semiconductor devices is limited by the ability to inspect the patterning mask 18. Another problem is that different wavelengths of light are used to inspect the mask 18 than are used to expose a wafer 30, so not all mask 18 problems are detected, or are not accurately detected.

Furthermore, a transfer problem called line shortening may occur when the mask 18 pattern is transferred to the semiconductor wafer 30 surface. FIG. 2 shows shortened dimensions 32 alongside holes 26. Shortened dimensions 32 may actually be transferred to the wafer 30 surface rather than pattern size 26 due to the optics involved in transferring the exposure light through the mask 18 and lens 20. Essentially, the desired pattern 26 shrinks to an undesired smaller size represented by rectangle 32. This results in an increased size island 34 between rectangular patterns 32.

Another prior art solution to address line shortening is double exposure or micro-stepping, which decreases the throughput, e.g. increases the time required to process a wafer. A single exposure step process is preferred because alignment problems and overlay problems can be introduced with double exposure. However, certain semiconductor lithography patterns, such as DRAM deep trench cells, are not printable on size in a single exposure step with state of the art exposure and mask-making capabilities, because extreme biases are required in the long axis of the features. The extreme biases are needed to compensate for line shortening at the exposure step. The extreme biases result in islands on the mask 30 that are too small to be inspected.

What is needed in the art is a patterning method and apparatus that alleviates the mask inspection limitations and alignment problems, and compensates for line shortening, problematic in the prior art.

SUMMARY OF THE INVENTION

These problems are generally solved or circumvented by the present invention that achieves technical advantages as a method and apparatus for patterning the surface of a semiconductor wafer. A mask is moved at a different speed than the wafer in a ratio different than the magnification factor during the scanning process to achieve more accurate, smaller dimensions on a wafer surface.

Disclosed is a process for patterning a semiconductor wafer, comprising covering the surface of the wafer with a patterned mask, and transferring the mask pattern to the wafer surface at a particular magnification factor, wherein transferring the mask pattern comprises exposing portions of the wafer surface while moving the wafer horizontally at a first speed and simultaneously moving the mask horizontally at a second speed, the first and second speeds being different from one another, wherein the ratio of the first and second speeds is different from the magnification factor.

Also disclosed is a semiconductor wafer lithography process comprising providing a semiconductor wafer, the wafer comprising a photoresist disposed thereon, providing a mask with a desired pattern thereon, positioning the mask between the wafer and a light source, and transferring the mask pattern to the wafer surface at a particular magnification factor, wherein transferring the mask pattern comprises moving the wafer while simultaneously laterally moving the mask and while illuminating the light source, wherein the wafer lateral movement is at a first speed and the mask lateral movement is at a second speed, the first and second speeds being different, wherein the ratio of the first and second speeds is different from the magnification factor.

Further disclosed is an apparatus for patterning a semiconductor wafer, comprising a stage for supporting a semiconductor wafer to be patterned, a motor coupled to the stage adapted to move the stage and wafer horizontally at a first speed during patterning, a patterned mask disposed over the stage, and a motor coupled to the mask adapted to move the mask horizontally at a second speed simultaneously with the horizontal movement of the stage during patterning, the first and second speeds being different, the apparatus adapted to transfer the mask pattern to the wafer at a particular magnification factor, wherein the ratio of the first and second speeds is different from the magnification factor.

Advantages of the invention include overcoming the limitations in inspecting mask dimensions used for patterning semiconductor wafer surfaces. The first and second horizontal speeds of the mask and the wafer, respectively, may be varied to increase or decrease the size of the pattern on the wafer with relation to the pattern on the mask, without being correlated to the magnification factor. Line shortening is reduced, or may be compensated for by varying the horizontal speeds of the wafer and mask. The invention is easily implemented in current step and scan apparatuses that are already adapted to move the mask and wafer. The mask pitch may be relaxed, and the mask may be designed with a increased pitch in the X direction to coincide with the scan direction of the exposure tool, creating an artificially created difference in X magnification. Minimum islands between trenches can be increased by utilizing the present invention using current lens magnification in a single exposure step. Alignment and overlay problems are eliminated by patterning a wafer with a single exposure. A single exposure also results in increased throughput. The mask error enhancement factor (MEEF) may also be reduced. Another advantage is the ability to increase the island size between trench hole patterns on a mask, producing a mask having an island size that is inspectable.

BRIEF DESCRIPTION OF THE DRAWINGS

The above features of the present invention will be more clearly understood from consideration of the following descriptions in connection with accompanying drawings in which:

FIG. 5 shows a mask and patterned wafer surface in accordance with a magnification scheme in an embodiment of the present invention; and FIG. 6 illustrates a mask and patterned wafer surface in accordance with a demagnification scheme in another embodiment of the present invention.

Corresponding numerals and symbols in the different figures refer to corresponding parts unless otherwise indicated. The figures are drawn to clearly illustrate the relevant aspects of the preferred embodiments, and are not necessarily drawn to scale.

DETAILED DESCRIPTION OF PREFERRED EMBODIMENTS

Preferred embodiments of the present invention will be described, followed by a discussion of some advantages of the present patterning method and apparatus.

Figure 1:
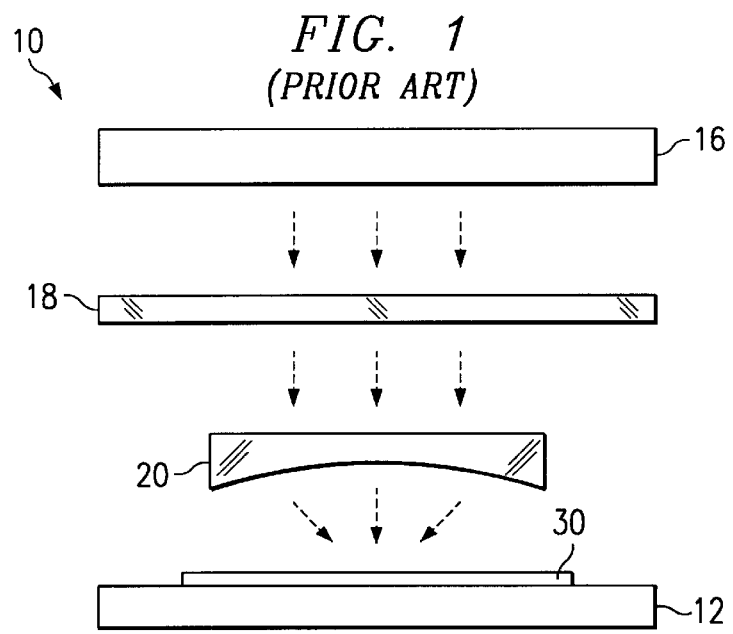
FIG. 1 illustrates a prior art patterning apparatus.
Figure 2:
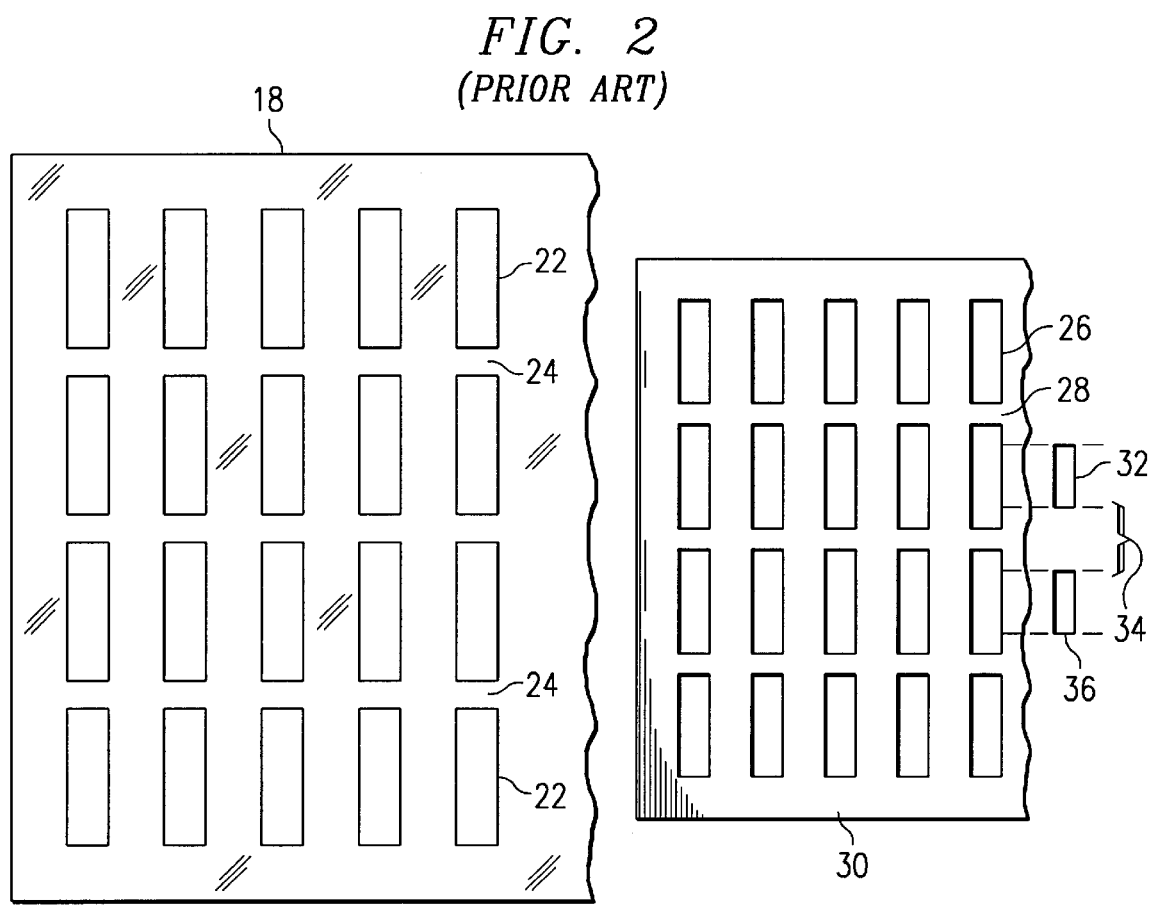
FIG. 2 shows a prior art mask and a portion of a semiconductor wafer surface patterned by the mask, exhibiting line shortening problems.
Figure 3:
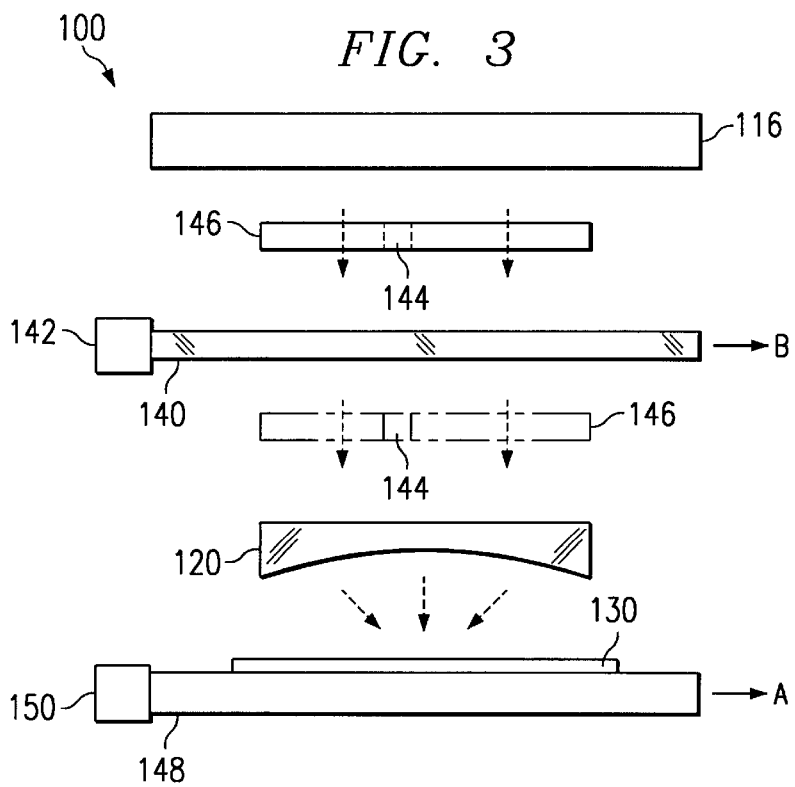
FIG. 3 illustrates the patterning apparatus in accordance with an embodiment of the present invention.

FIG. 3 shows a side view of an embodiment of the present invention, an apparatus or stepper 100 for patterning a semiconductor wafer 130 surface. A stage 148 is provided, adapted to support a semiconductor wafer 130. Stage 148 is coupled to a motor 150 that is adapted to move the stage 148 in the horizontal direction A, as shown. An optional lens 120 is disposed above the stage 148 and semiconductor wafer 130. The lens 120 preferably comprises a demagnification lens having a 4:1 or 5:1 magnification factor, for example, and may alternatively comprise a magnification lens. In a 1:1 magnification scheme, a lens 120 may not be required.

A mask 140 is disposed above the lens 120. The mask 140 may comprise chrome, for example, and may include a layout of predetermined transparent and opaque features. The transparent regions of mask 140 allow light to pass through to the wafer 130. The mask 140 is coupled to a motor 142 that is adapted to move the mask 140 in a horizontal direction B. A light source 116 is disposed above the mask 140. The light source 116 may comprise a laser, and alternatively may comprise a UV light or other light source, as examples.

A plate 146 having a slit 144 therein may be placed in the light path between the light source 116 and the wafer 130. The plate 146 may be disposed between the light source 116 and the mask 140, or alternatively, the plate 146 may be disposed between the mask 140 and the lens 120 (or wafer 130, if no lens 120 is present), shown in phantom, as examples. The slit 144 may be 2 mm wide and 30 mm long, for example. In accordance with the present invention, the horizontal speed A of the stage 148 is different than the horizontal speed B of the mask 140 during exposure of the wafer 130 in a ratio different than the magnification factor of the lens 120. This is advantageous because the dimensions of the pattern transferred to the wafer 130 may be varied by varying the difference in the horizontal speeds A and B.

Figure 4:
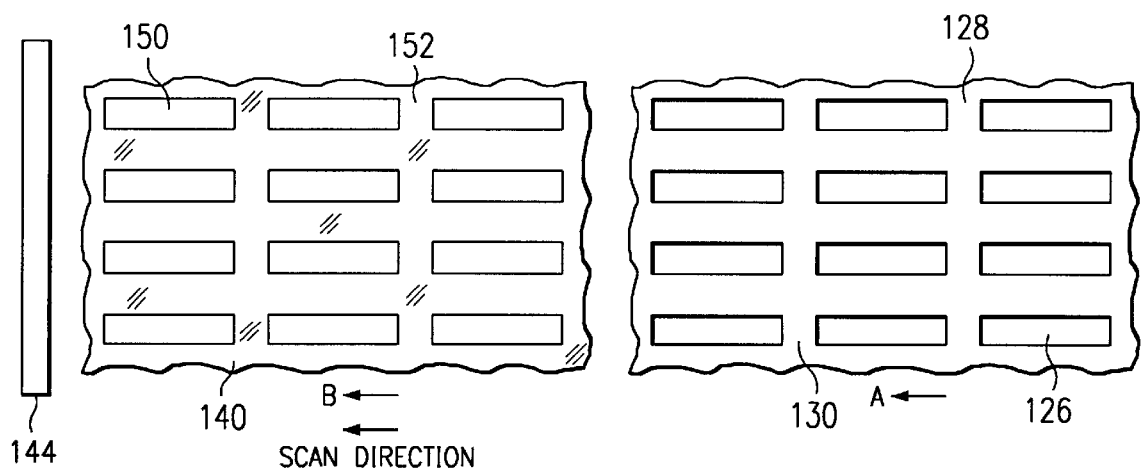
FIG. 4 shows a top view of a mask and wafer in a 1:1 patterning process in an embodiment of the present invention.

For example, in FIG. 4, a top view of a mask 140 and wafer 130 in a 1:1 patterning scheme in accordance with the present invention is shown. The speed B of the mask is intentionally desynchronized with the speed A of the wafer in accordance with the present invention, rather than being synchronized at the same speeds for a 1:1 patterning process as in the prior art. For example, wafer 130 speed A may be moved 1.1 times the mask speed B to attain a larger pattern on the wafer 130. By purposefully desynchronizing the mask speed B and the wafer speed A to a ratio different from the magnification factor which in this example is 1:1, the magnification becomes different in the scan direction.

FIG. 5 illustrates an embodiment of the present invention in which the scan directions A and B, respectively, of the wafer 130 and the mask 140 are represented in the X direction. The magnification of the lens 120 may be, for example, 1:2. The embodiment in FIG. 4 illustrates an adjusted stage synchronization, different than the 1:2 magnification factor of the lens 120, to obtain increased dimensions in a critical direction on wafer 130. For example, the mask 140 is moved in the X direction at horizontal speed B at a slower rate than the horizontal speed A of the wafer 130, with the speed ratio B:A being a ratio other than the 1:2 lens magnification factor, resulting in an enlarged dimension of the pattern 126 in the X direction on the wafer 130. Because mask holes 150 are passed by the slit 144 at a slower rate (than the 1:2 magnification factor) than the wafer 130 is passed in front of the lens 120, the pattern 126 is larger than if the speeds were synchronized with the 1:2 magnification factor. The chrome islands 128 and 152 also are enlarged compared to if the speeds are synchronized with the magnification factor. The X dimension x1 depicted on mask 140 refers to the horizontal dimension of the mask 140, and x(chrome)1 refers to the size of the islands 152. By varying the mask 140 and wafer 130 speed differential, a horizontal dimension x2=n*x1 may be achieved on the wafer 130, for example, with the size of the islands on the wafer 130 being x(chrome)2=n*x(chrome1).

Another embodiment of the present invention is shown in FIG. 6. In this embodiment, the mask 140 is moved at a faster speed B in the X direction than the wafer 130 is moved at speed A in the X direction, with the ratio B:A being different than the lens 120 magnification factor. This results in patterned regions 126 being smaller than if the speeds were synchronized with the magnification factor. This also applies to the chrome islands 128 on the wafer 130 and 152 of the mask 140.

Advantages of the invention include overcoming the limitations in inspecting mask dimensions used for patterning semiconductor wafer surfaces. The horizontal speeds A and B of the mask 140 and the wafer 130 may be varied to increase or decrease the size of the pattern on the wafer 130 with relation to the pattern on the mask 140 without being restricted to having a ratio corresponding to the magnification factor of lens 120. Line shortening is reduced, or may be compensated for by varying the horizontal speeds A and B of the wafer 130 and mask 140, respectively. The invention is easily implementable in current step and scan apparatuses that are already adapted to move the mask and wafer. The mask pitch may be relaxed by a factor. The mask 140 may be designed with an increased pitch in the X direction to coincide with the scan direction of the exposure tool. This creates an artificially created difference in X magnification. Minimum islands between trenches can be increased by utilizing the present invention using current lens magnification in a single exposure step.

Additional advantages include eliminating the alignment problems and overlay problems found in double exposure techniques, because a wafer 130 may be patterned with a single exposure, rather than multiple exposures, required in prior art double exposure and micro-stepping techniques. A single exposure process results in increased throughput, or decreased time to process wafers 130. Furthermore, the mask error enhancement factor (MEEF) may be reduced.

Another advantage is the ability to increase the island 152 size between trench hole 150 patterns on a mask 140, to produce a mask 140 having an island 152 size that is inspectable using current and future tool sets.

While the present patterning process is described herein with reference to a DRAM array, the present process and apparatus 100 may be utilized in the fabrication of other semiconductor devices such as magnetic random access memories (MRAM's), as an example.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A process for patterning a semiconductor wafer, comprising:

covering the surface of the wafer with a patterned mask; and exposing the wafer surface to the mask pattern at a first magnification factor, wherein exposing the wafer surface comprises exposing portions of the wafer surface to a light source while moving the wafer horizontally at a first speed and simultaneously moving the mask horizontally at a second speed, the first and second speeds being different from one another, wherein the mask pattern is transferred to the wafer surface at a second magnification factor, the second magnification factor being a function of the ratio of the first to second speeds, wherein the second magnification factor is different from the first magnification factor.

2. The process according to claim 1, wherein the wafer first speed is slower than the mask second speed, wherein the mask pattern transferred to the wafer is reduced in the horizontal direction.

3. The process according to claim 2, wherein the wafer and mask are moved in the same horizontal direction.

4. The process according to claim 3 further comprising depositing a photoresist over the wafer surface.

5. The process according to claim 4, wherein exposing the wafer surface comprises exposing portions of the photoresist.

6. The process according to claim 5, wherein the light source comprises a laser, wherein exposing the wafer surface comprises exposing the wafer to a laser through a slit in a plate disposed between the laser and the wafer.

7. The process according to claim 6, wherein exposing the wafer surface comprises exposing the wafer to the laser through a lens, wherein the lens comprises the first magnification factor.

8. The process according to claim 7 wherein exposing the wafer comprises patterning a matrix of DRAM cells.

9. The process according to claim 1, further comprising intentionally desynchronizing the second speed from the first speed so that the mask pattern is transferred to the wafer surface at a magnification factor different from the first magnification factor.

10. The process according to claim 1, wherein the wafer first speed is faster than the mask second speed, wherein the mask pattern transferred to the wafer is increased in the horizontal direction.

11. The process according to claim 1, wherein the first magnification factor is 1:1, wherein the second magnification factor is something other than 1:1.

12. A semiconductor wafer lithography process comprising:
providing a semiconductor wafer, the wafer comprising a surface having a photoresist disposed thereon;
providing a mask with a desired pattern thereon;
positioning the mask between the wafer and a light source, the mask having a pattern; and
exposing the wafer surface to the mask pattern at a first magnification factor, wherein exposing the wafer surface comprises moving the wafer while simultaneously laterally moving the mask and while illuminating the light source, wherein the wafer lateral movement is at a first speed and the mask lateral movement is at a second speed, the first and second speeds being different, wherein the ratio of the first to second speeds is different from the first magnification factor, wherein the first and second speeds are not synchronized.

13. The method according to claim 12, wherein the wafer first speed is slower than the mask second speed, wherein the mask pattern transferred to the wafer is reduced in the lateral direction.

14. The method according to claim 12, wherein the wafer and mask are moved in the same lateral direction.

15. The method according to claim 12, wherein the light source comprises a laser, further comprising exposing the wafer surface to the laser through a plate having a slit thereon disposed between the laser and the wafer.

16. The method according to claim 15, wherein exposing the wafer surface comprises exposing the wafer to a laser through a lens having a magnification factor.

17. The method according to claim 12, the second speed is intentionally desynchronized from the first speed so that the mask pattern is transferred to the wafer surface at a second magnification factor, the second magnification factor being different from the first magnification factor.

18. The method according to claim 12, wherein the wafer first speed is faster than the mask second speed, wherein the mask pattern transferred to the wafer is increased in the horizontal direction.

19. The process according to claim 18, wherein the first magnification factor is 1:1, wherein the second magnification factor is something other than 1:1.

20. A lithography process for semiconductor wafers, comprising:
providing a light source;
providing a semiconductor wafer, the semiconductor wafer having a photoresist disposed thereon;
disposing a mask having a pattern thereon between the light source and the semiconductor wafer, the photoresist being directed towards the light source;
exposing the photoresist of the semiconductor wafer to energy from the light source through the mask while moving the wafer laterally at a first speed and while moving the mask laterally at a second speed, the first speed being different from the second speed; and
intentionally desynchronizing the second speed from the first speed to effect the magnification of the pattern transferred from the mask to the wafer photoresist.

21. The lithography process according to claim 20, further comprising disposing a lens having a first magnification factor between the semiconductor wafer and the light source, wherein the mask pattern is transferred to the wafer photoresist at a second magnification factor, the second magnification factor being a function of the ratio of the first to second speeds.

22. The lithography process according to claim 20, wherein the wafer first speed is slower than the mask second speed, wherein the mask pattern transferred to the wafer is reduced in the horizontal direction.

23. The method according to claim 20, wherein the wafer first speed is faster than the mask second speed, wherein the mask pattern transferred to the wafer is increased in the horizontal direction.

* * * * *